United States Patent [19]

Chun

[11] Patent Number: 5,750,003
[45] Date of Patent: May 12, 1998

[54] CHUCK FOR HOLDING SEMICONDUCTOR PHOTOLITHOGRAPHY MASKS

[75] Inventor: Lee Meng Chun, Taipei, Taiwan

[73] Assignee: Taiwan Semiconductor Manufacturing Company, Ltd., Hsin-chu, Taiwan

[21] Appl. No.: 650,358

[22] Filed: May 20, 1996

[51] Int. Cl.$^6$ .................... H01L 21/00; B44C 1/22
[52] U.S. Cl. ............................ 156/345; 216/41
[58] Field of Search ............. 356/72, 360, 363; 156/345 L, 345 LS, 345 WH; 216/41, 92; 438/748

[56] References Cited

U.S. PATENT DOCUMENTS 5,202,748  4/1993  MacDonald et al. ............ 356/360
5,376,216  12/1994  Yoshioka et al. ............... 156/345

Primary Examiner—William Powell
Attorney, Agent, or Firm—George O. Saile; Stephen B. Ackerman; William J. Stoffel

[57] ABSTRACT

A mask chuck for fabricating a semiconductor mask which reduces spinning turbulence comprising: a top plate attached to a base by supports. The top plate has a cylindrical shape, a top surface, and rounded outer edges. The top plate preferably has a square opening extending through the top plate. Preferably four ledges extend out from along the corners of the opening. The four edges of the opening having four notches having ledges. Pins are mounted on the ledges. The pins extend upward towards the top surface of the top plate. A mask rests on the pins and the pins are adjusted so that the top surface of the mask is even with the top surface of said top plate. The mask chuck reduced turbulence having a cylindrical aerodynamic shape, an opening which is closely fitted to the mask and pins which level the top surface of the mask with the top surface of the chuck.

19 Claims, 5 Drawing Sheets

CHUCK FOR HOLDING SEMICONDUCTOR PHOTOLITHOGRAPHY MASKS

BACKGROUND OF THE INVENTION

1) Field of the Invention

This invention relates generally to a device for making photolithography masks used in semiconductor manufacturing and more particularly to an improved chuck which holds masks during spraying, etching, and developing operations.

2) Description of the Prior Art

Photolithography masks play an important role in semiconductor manufacturing. One of the steps in manufacturing semiconductor photolithography masks involves wet developing and etching patterns onto the masks. During these steps a mask is placed on a mask chuck. The mask chuck rotates at a high speed while nozzles spray various solutions onto the mask. It is important that the solutions are sprayed evenly onto the mask so that the patterns are developed uniformly across the entire mask. For example, it is important that the chromic acid etch solution is sprayed evenly on the mask to accurately etch the pattern in the chromium layer of the mask. Other important steps that require spray uniformity include the entire developing, etch, and rinse processes.

A shortcoming of conventional mask chucks are that they create excessive turbulence while spinning. This turbulence is often caused by raised structures (e.g., brackets) on the chuck top surface which are used to hold the mask in position and to hold the mask at the proper height in relationship to the spray nozzles. Also, non-aerodynamic chuck shapes and mask edges held above the top surface of the chuck create turbulence. This turbulence causes the spray from the nozzles to be unevenly distributed across the mask thereby degrading the patterns. Also the turbulence creates floating particles in the chamber. These particles can redistribute on the mask and create defects.

Another problem with current chucks are that masks of different dimensions (i.e., lengths and widths) and thicknesses are not held at the same height from the nozzles during the solvent spraying. This height difference for different mask thickness causes the nozzle spray pattern to vary. The different spray patterns cause uniformity problems and quality control problems in mask manufacturing. For example, current mask dimensions have about 5 inch and 6 inch outside square lengths. A 5 inch mask can have a thickness of about 0.09 inch whereas a 6 inch mask can have a thickness of about 0.25 inches. Because masks can have varying thicknesses, present mask chucks hold the masks at held at a different height and create varying spraying shapes on the recticle. Also, present mask chucks do not easily hold masks of different dimensions (e.g., lengths/widths).

It is also important that the mask chuck allows the mask to be accurately and easily leveled so that the mask will rotate properly and present a level surface to the nozzles so the mask can be sprayed properly. To monitor the mask level, a mirror mounted above the mask is used to view a pattern on the mask while it is rotating. If the image of the pattern reflected in the mirror is stable or static, then the mask is level. If the image vibrates or moves, the mask is no longer level.

In addition, current mask chucks have safety concerns where the masks are not held securely in the chuck and have spun out. Also, mask chucks often require operators to use their hands to remove and load the masks on the mask chuck. The mask chuck must also be safe and hold the mask securely.

Therefore, there is a need to develop a mask chuck which reduces the amount of turbulence generated by a spinning mask. Also there is a need for a mask chuck which can hold masks of different dimensions and thicknesses at a constant distance from spray nozzles to ensure uniform spray and to minimize the amount of turbulence by providing a flat surface. There is a need to provide a mask chuck which allows the masks to be moved without human operators having to use their hands. Moreover, there is a need for a mask chuck that can accurately level the mask and provide a superior static mirror image showing the mask is level.

U.S. Pat. No. 5,202,748 (MacDonald et al.) shows an in-situ process control system for steppers where a control processor adapts the stepper to the desired characteristics by causing changes in the focus, mask manipulation and wafer chuck manipulation. However, the patent does not discuss the wafer chuck details relating to mask size differences and the shape of the chuck to reduce turbulence.

SUMMARY OF THE INVENTION

It is an object of the present invention to provide a mask chuck which reduces the amount of turbulence generated from the spinning chuck and mask.

It is another object of the present invention to provide a mask chuck which can hold different size (length and thicknesses) masks at a constant distance from spray nozzles and also minimize turbulence by holding the top surface of the mask level with the chuck top surface.

It is still another object of the present invention to provide a mask chuck which reduces the amount of spray contamination within the spraying chamber.

It is yet another object of the present invention to provide a mask chuck with the ability to accurately level of the mask so as to provide a superior static mirror image.

To accomplish the above objectives, the present invention provides a mask chuck which reduces the amount of turbulence, handles masks of different sizes and thicknesses, provides adjustments to accurately level masks, and provides grooves for mask picks.

The invention provides a mask chuck for fabricating semiconductor mask which reduces spinning turbulence comprising: a top plate attached to a base by supports. The top plate has a cylindrical shape, a top surface and rounded edges (e.g., surface angles). The top plate preferably has a square opening in the top surface extending through the top plate. The square opening preferably has four ledges in the four corners. This first square opening holds a first mask.

The opening also preferably has four notches in the four sides (of the opening) which also have ledges 24A. These notches are used to hold a second mask preferably of a difference size (e.g., smaller) than the first mask. The top plate preferably has a square opening with four ledges in the four corners and four ledges in the four notches on the sides of the opening (total of 8 ledges). Pins are mounted on the ledges (e.g., 8 pins). The pins extend upward towards the top surface of the top plate. A mask rests on the pins. The opening and notches can accommodate two different size masks. A larger mask can fit in the ledges in the corners of the opening. A small mask can fit in the notches in the sides of the opening. The heights of the pins are adjusted so that the top surface of the mask is even with the top surface of the top plate. The adjustment of the height of the pins is preferably made by set screws in the ledges.

The mask chuck of the present invention has rounded edges and a streamlined design which reduces the amount of turbulence. The top surface of the mask is adjustable by the pins so that the mask is even with the top surface of the mask chuck. The mask chuck is aerodynamically designed as a thin cylinder similar to a racing bicycle wheel for additional streamlining. The mask chuck of the present invention also provides adjustable height pins so that masks of different thicknesses can be leveled easily and adjusted for their height to make the mask even with the chuck top surface. The chuck provides mask pick spacer for mask picks for both the developer and etcher operations which eliminates operator handling of the masks.

The mask chuck of the present invention significantly reduces contamination because of the reduce turbulence. This has resulted in better critical dimension uniformity and significantly reduces defect rates at the etching station. In manufacturing implementations, it is estimated that the mask chuck of the present invention has increased critical dimension uniformity by about 20% and has reduced defects by about 20% compared to the conventional mask chuck.

BRIEF DESCRIPTION OF THE DRAWINGS

The features and advantages of a mask chuck according to the present invention and further details of a process of fabricating such a mask chuck in accordance with the present invention will be more clearly understood from the following description taken in conjunction with the accompanying drawings in which like reference numerals designate similar or corresponding elements, regions and portions and in which:

FIG. 3A is a side view of the pins for the mask chuck of the present invention.

FIG. 3B is a top down expanded view of the ledge 24 and corner of the opening 18 as shown in FIG. 1 of the mask chuck of the present invention.

DETAILED DESCRIPTION OF THE PREFERRED EMBODIMENTS

Figure 1:
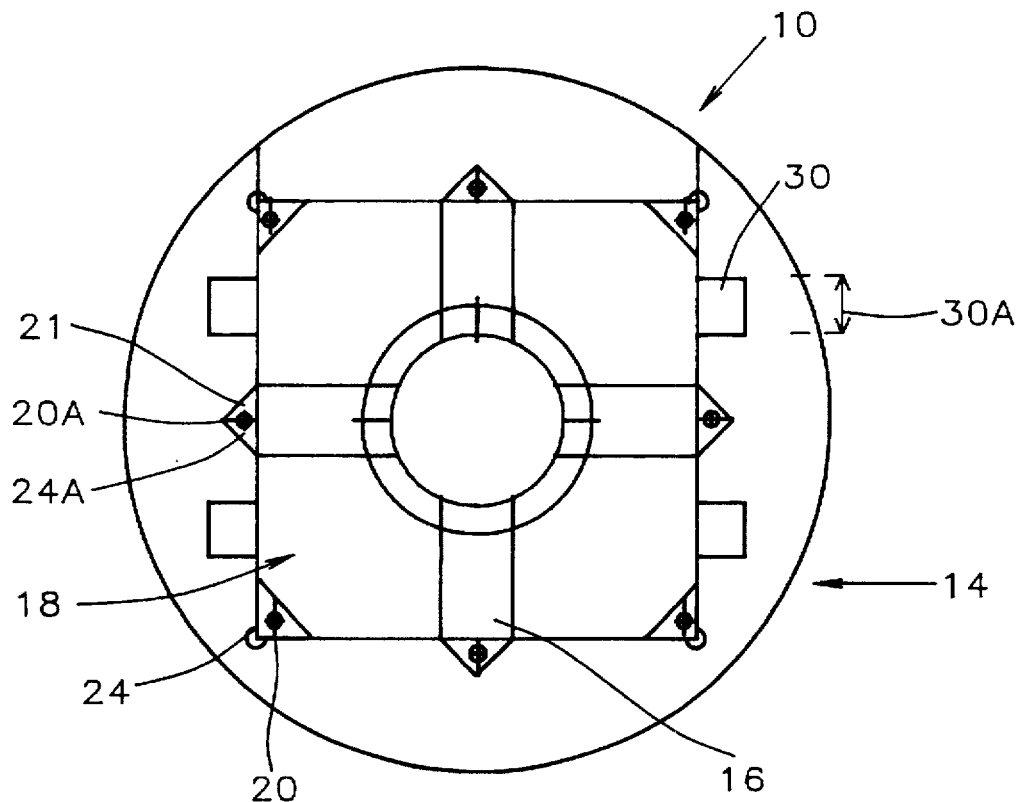
FIG. 1 is a top down view of the mask chuck of the present invention.

To accomplish the above objectives, the present invention provides a mask chuck which reduces the amount of turbulence, handles masks of different sizes and thicknesses, provides adjustments for mask height and leveling, and provides grooves for mask picks.

As shown in FIGS. 1, 2, 4A, 5, and 6 the invention provides a mask chuck 10 for fabricating semiconductor masks which reduces spinning turbulence caused by the mask 50 and mask chuck. The mask chuck 10 has a top plate 14 attached to a base 12 by supports 16. The base 12 is connected to a means for rotation, such as an electric motor and can have any structure capable of securely mounting to the motor.

Figure 2:
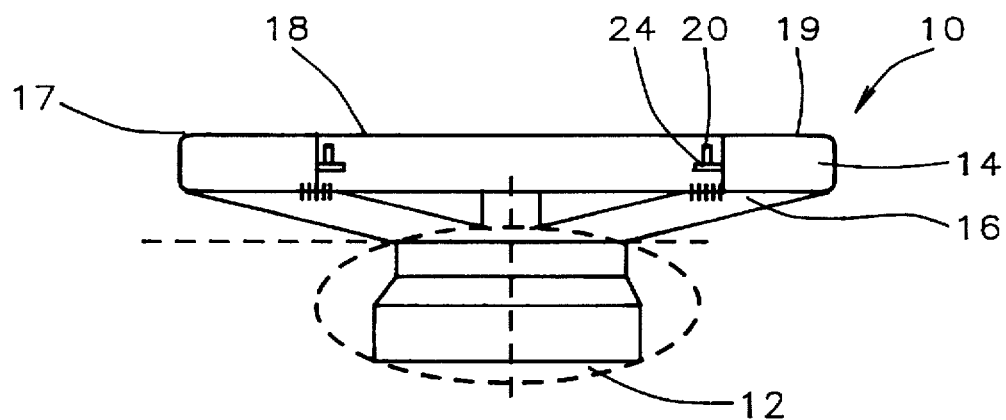
FIG. 2 is a side view of the mask chuck of the present invention.

Referring to FIGS. 1 and 2, the top plate 14 has a thin cylindrical shape, a top surface 19 and rounded edges, such as the top outer edge 17 and the edges of the opening 18. The top plate 14 preferably has a narrow cylindrical shape in order to reduce spinning turbulence. The top plate 14 preferably has a diameter in the range of between about 235 and 250 mm, and more preferably about 240 mm. The top plate has preferably a thickness in the range of between about 17 and 30 mm, and more preferably about 20 mm. The top plate is preferably formed of PVDF or other material similar to a Teflon® material.

As shown in FIGS. 1 and 2, the top plate 14 is attached to the base 12 by supports 16. The supports are preferably positioned at 90 angles from each other. The supports are preferably formed of PVDF or Teflon® material (polytetrafluoroethylene) or similar material.

As shown in FIG. 1, the top plate 14 preferably has a square opening 18 extending at least partially through the top plate 14. The opening 18 preferably extends entirely through the top plate. This allows a back side rinse of the mask from a sprayer located underneath the mask.

The opening 18 is preferably square shaped. The opening 18 preferably has ledges 24 and pins 20 located in the four corners. The opening 18 is made to fit the size and shape of the masks being processed. For a 6" mask the opening 19 preferably has a length/width in the range of between about 152 and 153 mm and more preferably about 152.5 mm. Therefore 6" mask preferably has a length/width in the range of between about 152 and 153 mm and more preferably about 152.5 mm.

Figure 5:
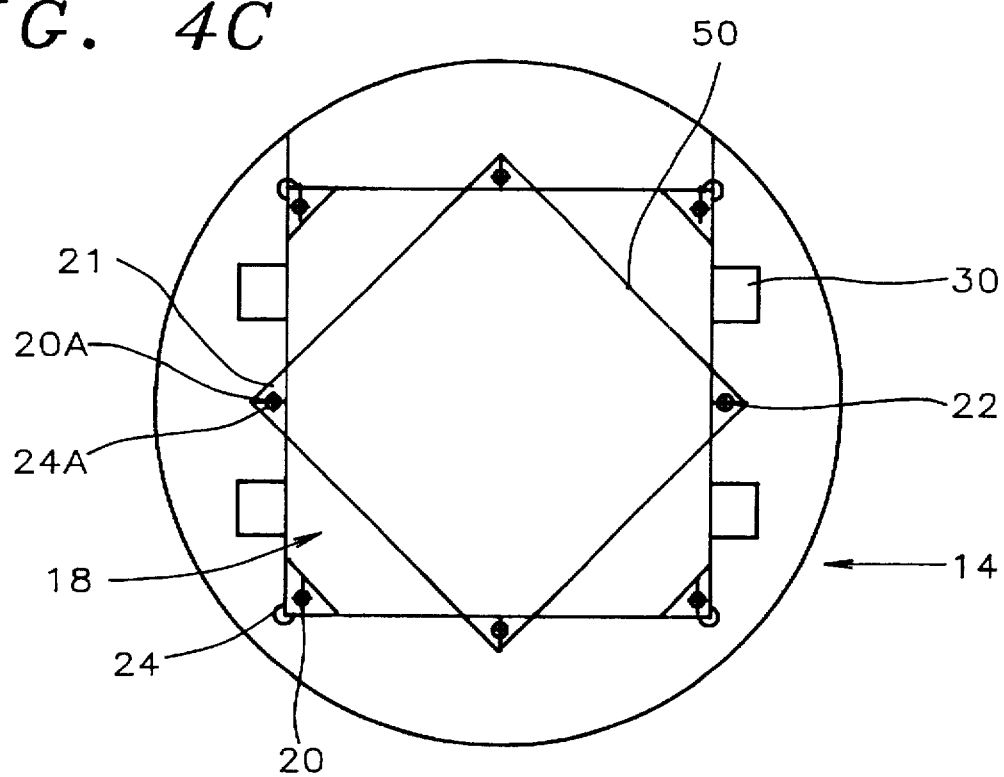
FIG. 5 is a top down view of the mask chuck of the present invention showing a mask 50 resting in the mask chuck.

The opening 18 preferably has notches 21 (e.g., angular indentations) located on its sides as shown in FIG. 1. The notches 21 contain also ledges 20A and pins 21A. The notches 21 are preferably used to hold a second mask 50 of a different size than the mask held by the square opening. See FIG. 5. The notches 21, ledges 20A and pins 21A are preferably used to hold a smaller sized mask than the size of the opening 18. For example, as shown in FIG. 5, the notches 21 could fit a 5 inch diameter mask 50 while the opening 18 could fit a 6 inch diameter mask. The ledges 24 and 24A can also have different size pin 20 20A which could be used for different thicknesses masks.

As shown in FIG. 1, preferably eight ledges 24 24A extend out from along the edge and corners of the opening 18 and notches 21. Preferably the top plate includes two sets of four ledges (total of eight). The sets of four pins are preferably positioned at 90 degree angles to one and other. These ledges 24 24A are used to mount pins 20 onto which support the mask in the opening 18. The ledges 24 24A are preferably formed of PVDF, polytetrafluoroethylene, or similar material.

Figure 3C:
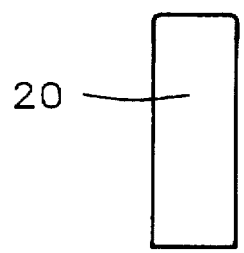
FIG. 3C is an expanded top plan view of the ledge 24 of the mask chuck of the present invention.
Figure 3C:
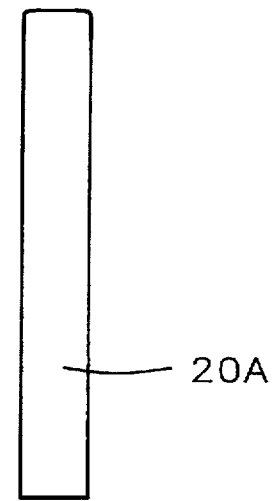
Figure 3C:
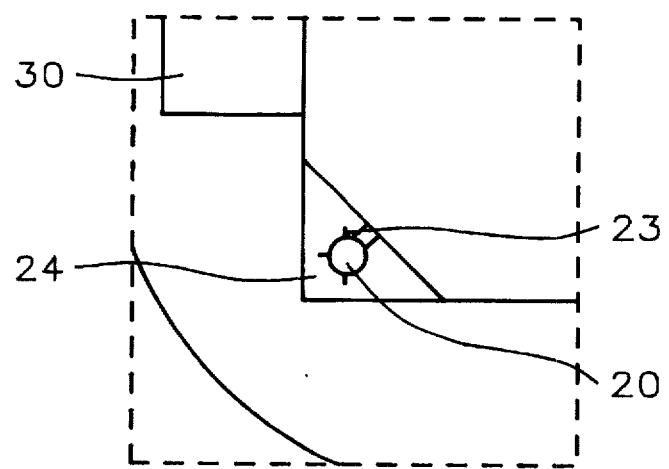

As shown in FIGS. 1, 3A, and 3B pins 20 20A are mounted on the ledges 24 24A to support and align the mask. The pins 20 extend upward towards the top surface 19 of the top plate 14. In operation a mask rests on the pins 20. The pins 20 are adjusted so that the top surface of the mask is even with the top surface 19 of the top plate 14. The height of the pins 20 20A is preferably adjusted using set screws 23 in the ledge 24 24A, as shown in FIG. 3C. As shown in FIGS. 3A and 3B, different height pins are used to support different thickness masks.

For a 6 inch photo mask, the pins 20 20A preferably have a height in the range of between about 13 and 15 mm and more preferably about 14 mm. For a 5 inch photo mask, the pins preferably have a height in the range of between about 26 and 28 mm and more preferably about 27 mm. The pins 20 20A preferably have a diameter in the range of between about 4.9 and 5.1 mm and more preferably about 5 mm. The pins are preferably formed of polytetrafluoroethylene or PVDF.

Figure 4A:
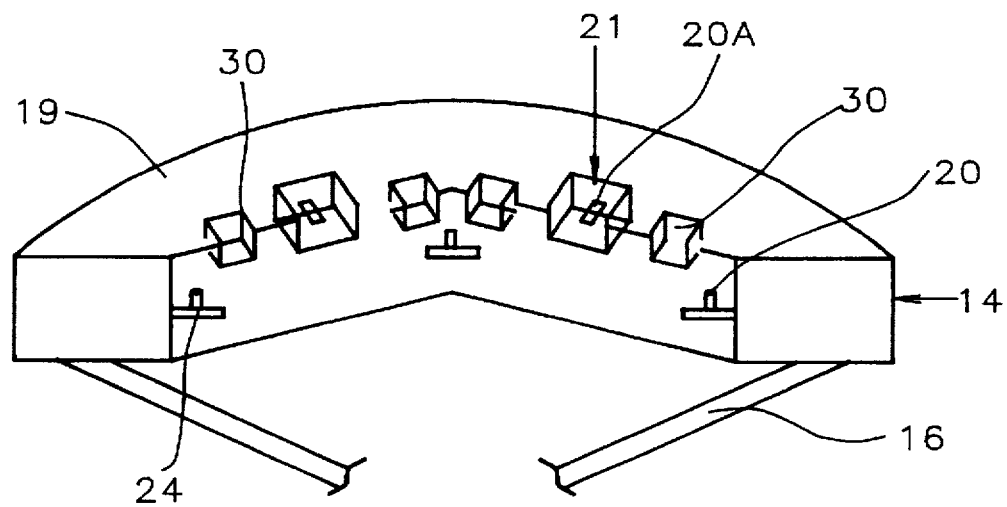
FIG. 4A is a cut away side view of the mask chuck of the present invention.
Figure 4B:
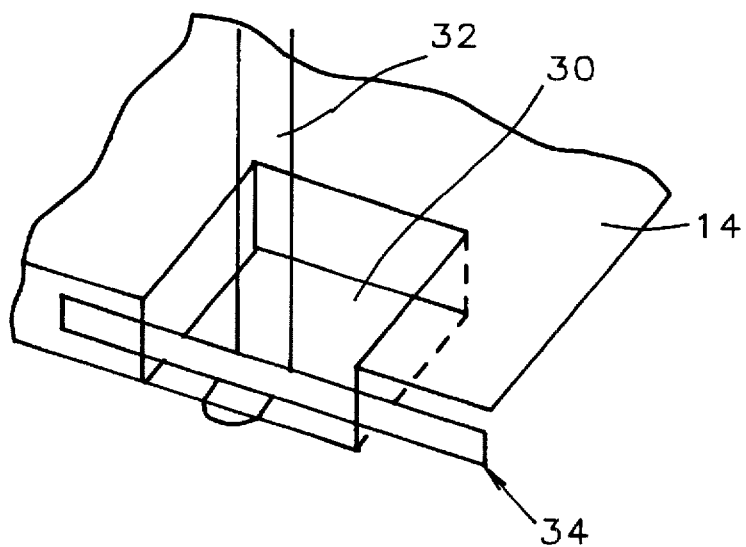
FIG. 4B is an expanded perspective view of the mask pick space 30 of the mask chuck of the present invention.
Figure 4C:
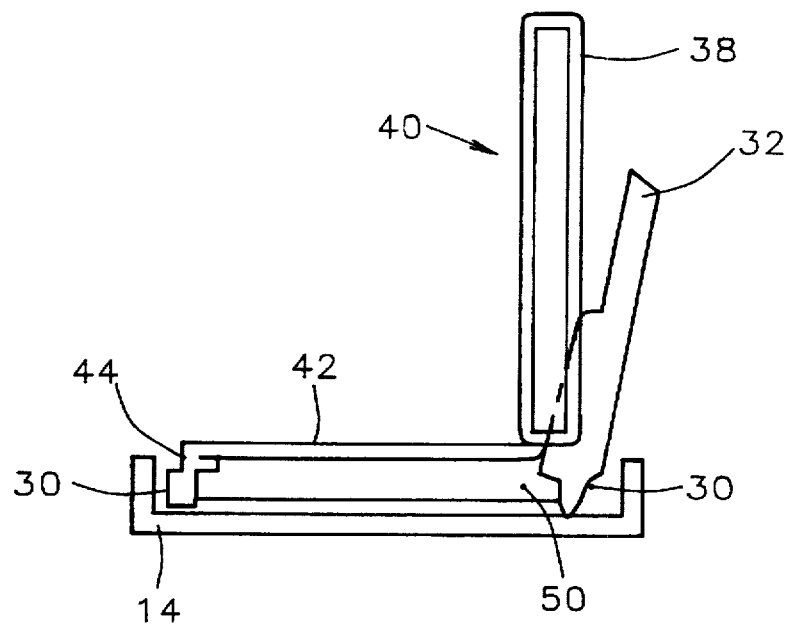
FIG. 4C is a side view of the mask pick spacer 30 and mask pick 40 holding a mask 50 in the mask chuck of the current invention.

As shown in FIGS. 1, 4A, 4B, and 4C the top plate includes a grooves (or mask pick spaces) 30 for mask picks 40. The grooves preferably have a width 30A in the range of between about 22 and 30 mm and more preferably about 25 mm. The grooves 30 preferably have a rectangular shape. As shown in FIGS. 4A, 4B, and 4C, masks 50 can be picked up using mask picks 40 using the mask pick spaces 30 in the mask chuck 10. The mask pick 40 comprises a handle 38, trigger 32, bar 42, and gripper 44. The mask pick trigger 32 picks up the edge 34 of the mask 50 in the pick space 30 as shown in FIGS. 4B and 4C. This eliminates the need for the operators to handle masks with their hands during loading and unloading. Note that when the mask is in the notches 21, (see FIG. 5), the mask picks 40 can fit into the space near the corners of the opening 18 on the sides of the mask 50 and lift the mask.

Figure 6:
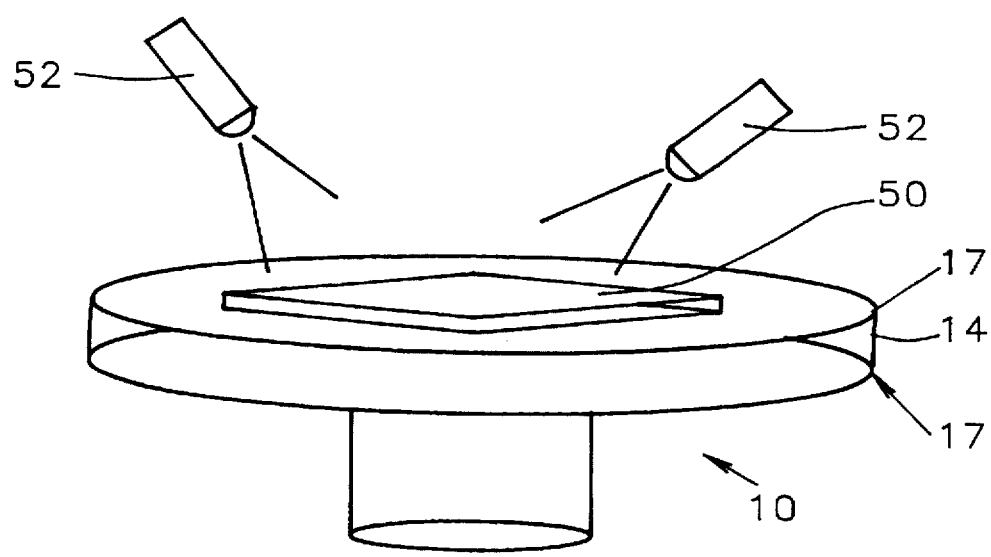
FIG. 6 is a perspective view of the mask chuck and top plate of the present invention.

As shown in FIG. 6, the mask 50 rests in the opening in the top plate 14 of the mask chuck 10. The top surface of the mask is even and level with the top surface of the top plate. Nozzles 52 spray liquids on the mask 50. The top plate 14 has rounded edges 17 to reduce turbulence.

The mask chuck and all of the parts of the mask chuck, except the set screws 23, are preferably formed of PVDF or a material similar to polytetrafluoroethylene. This material is very chemically inert and will not contaminate the mask patterns. Other suitable materials may be used.

The mask chuck of the present invention has a streamlined design/shape which reduces the amount of turbulence. The mask position is even with the top surface of the mask chuck. The mask chuck is aerodynamically shaped similar to a racing bicycle wheel for additional streamlining. The mask chuck of the present invention also provides adjustable pins so that masks of different thicknesses can be leveled easily and adjusted for their height to make the mask even with the chuck top surface. The mask chuck provides mask pick spaces 30 for mask picks which eliminate the need for operators to use their hands to load or unload the wafers. The adjustable pins 20 20A provide a method to fast and accurately level the mask. The notches 20A allow masks of different sizes to be used in the same chuck.

The mask chuck of the present invention significantly reduces contamination because of the reduce turbulence. This has resulted in better critical dimension uniformity and significantly reduces defect rates at the etching station. In manufacturing implementations, it is estimated that the mask chuck of the present invention has increased critical dimension uniformity by about 20% and has reduced defects by about 20% compared to the conventional mask chuck.

While the invention has been particularly shown and described with reference to the preferred embodiments thereof, it will be understood by those skilled in the art that various changes in form and details may be made without departing from the spirit and scope of the invention.

What is claimed is:

1. A mask chuck for fabricating a semiconductor mask which reduces spinning turbulence comprising:

a) a cylindrical top plate attached to a base by supports, said top plate having a top surface;

b) said top plate having a cylindrical shape, a top surface, and rounded edges;

c) said top plate having an opening, said opening have four corners;

d) four ledges extending out from along said corners of said opening; and e) pins on said ledges, said pins extending upward towards the top surface of said top plate whereby a mask rests on said pins and said pins are adjusted so that the top surface of said mask is even with the top surface of said top plate.

2. The mask chuck of claim 1 wherein said opening is square shaped.

3. The mask chuck of claim 1 wherein said mask chuck is formed of polytetrafluoroethylene and said pins are formed of PVDF.

4. The mask chuck of claim 1 wherein said top plate has a diameter in the range of between about 235 and 250 mm.

5. The mask chuck of claim 1 wherein said top plate has a thickness in the range of between about 17 and 30 mm.

6. The mask chuck of claim 1 wherein said top plate is attached to said base by four supports said supports positioned at 90 angles from each other.

7. The mask chuck of claim 1 wherein said pins have a height in the range of between about 13 and 28 mm and a diameter in the range of between about 4.9 and 5.1 mm.

8. The mask chuck of claim 1 wherein the height of said pins is adjustable by set screws.

9. The mask chuck of claim 1 wherein said top plate includes a mask pick space, said mask pick space having a width in the range of between about 22 and 30 mm.

10. The mask chuck of claim 1 wherein said top plate includes a mask pick space, said mask pick space having a width in the range of between about 22 and 30 mm.

11. The mask chuck of claim 1 wherein said opening is square shaped having sides, said opening having four notches in said sides, said notches having four second ledges; and four second pins on said second ledges in said four notches.

12. A mask chuck for fabricating a semiconductor photolithography mask which reduces spinning turbulence comprising:

a) a top plate attached to a base by four supports;

b) said top plate having a cylindrical shape, a top surface and rounded edges;

c) said top plate having a square opening, said square opening having four sides and four corners;

d) four notches in said four sides of said square opening;

e) four ledges extending out from along said four corners of said square opening;

f) pins on said ledges in said notches, said pins extending upward towards said top surface of said top plate;

set screws in said ledges whereby the height of said pins can be adjusted by said set screws, whereby a mask rests on said pins and said pins are adjusted so that the top surface of said mask is even with said top surface of said top plate.

13. The mask chuck of claim 12 wherein said mask chuck and said pins are formed of a material selected from the group consisting of polytetrafluoroethylene and PVDF.

14. The mask chuck of claim 12 wherein said top plate has a diameter in the range of between about 235 and 250 mm.

15. The mask chuck of claim 12 wherein said top plate has a thickness in the range of between about 17 and 30 mm.

16. The mask chuck of claim 12 wherein said top plate is attached to said base by four supports, said supports positioned at 90 angles from each other.

17. The mask chuck of claim 12 wherein said pins have a height in the range of between about 13 and 28 mm and a diameter in the range of between about 4.9 and 5.1 mm.

18. The mask chuck of claim 12 wherein said top plate includes a mask pick space, said mask pick space having a width in the range of between about 22 and 30 mm.

19. The mask chuck of claim 12 wherein said opening is square shaped having sides, said sides of said opening having four notches;

said four notches having four-second ledges; and four second pins on said second ledges in said four notches.

* * * * *